(12) United States Patent
Schulze et al.

(10) Patent No.: US 9,601,368 B2
(45) Date of Patent: Mar. 21, 2017

(54) SEMICONDUCTOR DEVICE COMPRISING AN OXYGEN DIFFUSION BARRIER AND MANUFACTURING METHOD

(71) Applicant: Infineon Technologies AG, Neubiberg (DE)

(72) Inventors: Hans-Joachim Schulze, Taufkirchen (DE); Johannes Baumgartl, Riegersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/801,087

(22) Filed: Jul. 16, 2015

(65) Prior Publication Data
US 2017/0018457 A1    Jan. 19, 2017

(51) Int. Cl.
*H01L 31/00* (2006.01)
*H01L 21/768* (2006.01)
*H01L 23/48* (2006.01)

(52) U.S. Cl.
CPC ...... *H01L 21/76841* (2013.01); *H01L 23/481* (2013.01)

(58) Field of Classification Search
CPC .................. H01L 21/76841; H01L 23/481
USPC .................................. 438/455, 459
See application file for complete search history.

(56) References Cited

U.S. PATENT DOCUMENTS

| 8,927,318 B2 * | 1/2015 | Bedell .............. H01L 21/02535 136/256 |
| 2012/0080690 A1 * | 4/2012 | Berger ................... H01L 29/02 257/77 |
| 2012/0156861 A1 * | 6/2012 | de Souza .......... H01L 21/76251 438/459 |

OTHER PUBLICATIONS

Khirunenko, L. I. et al., "Oxygen Diffusion in Si1-xGex Alloys", Solid State Phenomena, vols. 156-158, 2010, pp. 181-186.
Gusakov, Vasilii, "Quantumchemical simulation of diffusion in alloys: diffusion of interstitial oxygen atoms in Si1-x Gex", Physica Status Solidi C 8, No. 3, 2011, pp. 682-685.
Meyer, D.J., "Si-Based Alloys: SiGe and SiGe:C", Silicon Epitaxy, vol. 72, Chapter 10, Academic Press, San Diego, California, 2001, pp. 345-348.

* cited by examiner

*Primary Examiner* — Hung Vu
(74) *Attorney, Agent, or Firm* — Murphy, Bilak & Homiller, PLLC

(57) ABSTRACT

An embodiment of a method of manufacturing a semiconductor device includes forming an oxygen diffusion barrier on a first surface of a Czochralski or magnetic Czochralski silicon substrate. A silicon layer is formed on the oxygen diffusion barrier. P-doped and n-doped semiconductor device regions are formed in the silicon layer. The method also includes forming first and second load terminal contacts.

16 Claims, 6 Drawing Sheets

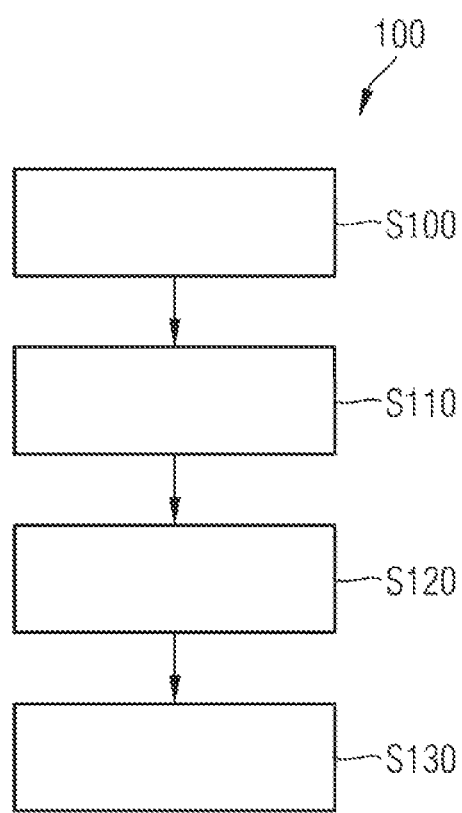

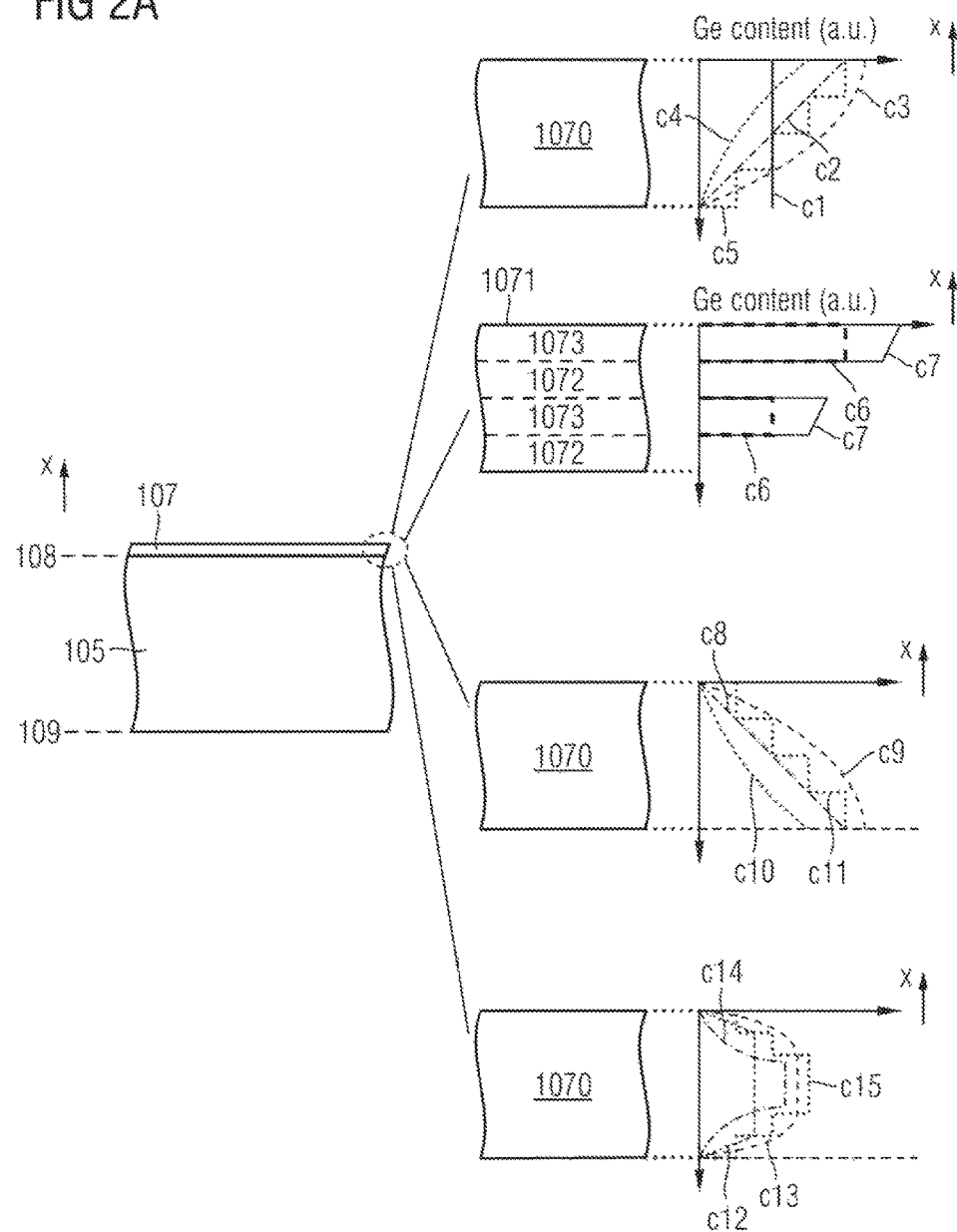

SEMICONDUCTOR DEVICE COMPRISING AN OXYGEN DIFFUSION BARRIER AND MANUFACTURING METHOD

BACKGROUND

In semiconductor power devices, for example semiconductor diodes, insulated gate field effect transistors (IGFETs), insulated gate bipolar transistors (IGBTs), thyristors, bipolar junction transistors (BJTs) voltage blocking requirements are typically met by a. Oxygen incorporated into the lightly doped drift or base zone, for example due to diffusion out of an oxygen-containing semiconductor substrate may act as a thermal donor and cause undesired fluctuations of a doping concentration in the drift or base zone or of a field stop zone. Also a free carrier lifetime in the drift or base zone may be adversely affected.

It is desirable to decrease fluctuations of doping concentrations in semiconductor devices and to provide a respective method of manufacturing.

SUMMARY

The present disclosure relates to a method of manufacturing a semiconductor device. The method comprises forming an oxygen diffusion barrier on a first surface of a Czochralski or magnetic Czochralski silicon substrate and forming a silicon layer on the oxygen diffusion barrier. The method further comprises forming doped semiconductor device regions in the silicon layer and forming first and second load terminal contacts.

The present disclosure also relates to a semiconductor device. The semiconductor device comprises a semiconductor body comprising opposite first and second surfaces. The semiconductor device also comprises a drift or base zone in the semiconductor body and an oxygen diffusion barrier in the semiconductor body. The drift or base zone is located between the first surface and the oxygen diffusion barrier and directly adjoins the oxygen diffusion barrier. The semiconductor device further comprises first and second load terminal contacts, wherein at least one of the first and the second load terminal contacts is electrically connected to the semiconductor body through the first surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1 is a schematic flow diagram for illustrating a method of manufacturing a semiconductor device.

FIGS. 2A to 2C are schematic cross-sectional views of a Czochralski or magnetic Czochralski silicon substrate for illustrating processes of a method of manufacturing a semiconductor device.

DETAILED DESCRIPTION

Figure 2B:
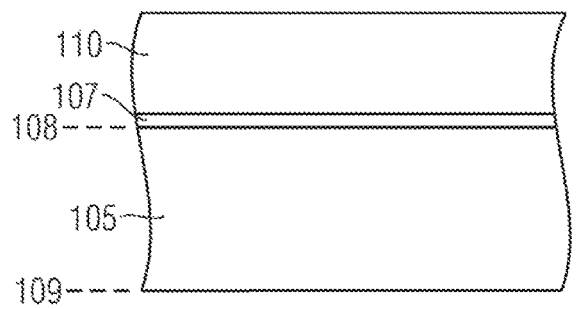

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOT), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 100 of manufacturing a semiconductor device.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 includes forming an oxygen diffusion barrier on a first surface of a Czochralski (CZ) or magnetic Czochralski (MCZ) silicon substrate. In some embodiments, a diffusion coefficient of oxygen in the oxygen diffusion barrier is at least 3 times smaller, or at least 5 times smaller, or at least 10 times smaller than a diffusion coefficient of oxygen in silicon at room temperature. The diffusion coefficient depends on the Ge concentration and thickness of the SiGe barrier layer, for example. The size of both parameters depend also on the workflow route of the device to achieve defect free semiconductor layers. The oxygen diffusion barrier may continuously cover the first surface of the Czochralski or magnetic Czochralski silicon substrate.

Process feature S110 includes forming a silicon layer on the oxygen diffusion barrier. In some embodiments, the silicon layer is formed by epitaxial growth or deposition, for example by chemical vapor deposition such as Atmospheric Pressure CVD (APCVD), Sub-Atmospheric Pressure CVD (SACVD), or Low-Pressure CVD (LPCVD).

Process feature S120 includes forming doped semiconductor device regions in the silicon layer. In some embodiments, source, body and drain regions of an IGFET are formed by ion implantation and/or diffusion of dopants into the silicon layer and/or Czochralski or magnetic Czochralski silicon substrate. In some other embodiments, source and body regions of an IGBT emitter and a bipolar injection region of an IGBT collector are formed by ion implantation and/or diffusion of dopants into the silicon layer and/or Czochralski or magnetic Czochralski silicon substrate. In some other embodiments, anode and cathode regions of a power pn junction diode are formed by ion implantation and/or diffusion of dopants into the silicon layer and/or Czochralski or magnetic Czochralski silicon substrate. Additional functional semiconductor regions such as highly doped contact regions for providing ohmic contacts to load terminal contacts, buffer regions, or field stop zones may be formed.

Process feature S130 includes forming first and second load terminal contacts. In some embodiments, the first and second load terminal contacts are source and drain contacts of an IGFET. In some other embodiments, the first and second load terminal contacts are anode and cathode contacts of a semiconductor power diode. In some other embodiments, the first and second load terminal contacts are collector and emitter contacts of an IGBT or a BJT.

In some embodiments, the process of forming the oxygen diffusion barrier comprises forming a SiGe diffusion barrier. A maximum Ge content in the SiGe diffusion barrier may be set to a value between 1% and 40%, or to a value between 2% and 20%.

In some embodiments, a thickness of the SiGe diffusion barrier is set to a value between 0.2 µm and 2 µm, or to a value between 0.5 µm and 1.5 µm. The feasible thickness of the layers depend also on Ge concentration and the following thermal budget of device manufacturing to assure defect free semiconductor layers. The thickness of the SiGe diffusion barrier may be set smaller than a so-called critical thickness being a maximum thickness of the SiGe diffusion barrier that allows for defect-free epitaxial growth. The critical thickness may depend from the Ge content in the SiGe diffusion barrier and from a temperature during growth of the SiGe diffusion barrier, for example.

In some embodiments, the Ge content in the SiGe diffusion barrier is set to increase continuously or stepwise from a surface of the Czochralski or magnetic Czochralski silicon substrate along a direction perpendicular to the surface. This may be caused by a continuous or stepwise increase of CVD Ge precursor gas flow, for example germane ($GeH_4$) gas flow into a CVD chamber, for example.

In some embodiments, the SiGe diffusion barrier is formed as a superlattice comprising SiGe and Si layers. The thickness of each layer of the supperlattice may be chosen below a critical value from which crystal defect generation starts.

In some embodiments, carbon is added to the SiGe diffusion barrier.

In some embodiments, a thickness of the silicon layer is set to a value between 40 µm and 200 µm. The value may depend from voltage blocking requirements of the semiconductor device, for example.

In some embodiments, a material of the Czochralski or magnetic Czochralski silicon substrate is removed from a second surface of the Czochralski or magnetic Czochralski silicon substrate opposite to the first surface. The material may be removed by chemical and/or mechanical processes, for example by etching and/or grinding. In some embodiments, the Czochralski or magnetic Czochralski silicon substrate is completely removed. The oxygen diffusion barrier may act as a etch stop or grinding stop layer. By way of example, a characteristic during etching and/or grinding may be altered when reaching the oxygen diffusion barrier. By detecting the change in the characteristic, etching and/or grinding may be stopped, for example.

In some embodiments, hydrogen related donors are formed in the silicon layer and/or the Czochralski or magnetic Czochralski silicon substrate, for example by a process of irradiating the silicon layer and/or the Czochralski or magnetic Czochralski silicon substrate with protons. According to an embodiment, the proton irradiation is carried out at energies ranging from one or several hundreds of keV to 5 MeV, or from 200 keV to 4 MeV, or from 300 keV to 1.5 MeV. According to another embodiment, a plurality of proton irradiations, for example two, three, four or five proton irradiations are carried out at different energies, e.g. from below 500 keV to more than 1 MeV. Multiple proton irradiations at different energies allow for manufacturing a field stop zone including a plurality of doping peaks, for example. According to an embodiment, the proton irradiation is carried out at a dose ranging from $0.5 \times 10^{13}$ protons/cm$^2$ to $5 \times 10^{14}$ protons/cm$^2$. According to another embodiment, a plurality of proton irradiations, for example two, three, four or five proton irradiations are carried out at different doses. A sum of all irradiation doses of the plurality of proton irradiations may range from several $10^{13}$ protons/cm$^2$ to tens of $10^{14}$ protons/cm$^2$, e.g. from $2 \times 10^{13}$ protons/cm$^2$ to $8 \times 10^{14}$ protons/cm$^2$. Also a combination of different irradiation doses and energies may be used to achieve a desired profile of a field stop zone.

The silicon layer and/or the Czochralski or magnetic Czochralski silicon substrate may be annealed in a temperature range of 300° C. to 550° C., or between 350° C. to 430, or between 380° C. to 420° C. The process of annealing may be carried out in a thermal processing system, for example in a furnace and/or a rapid thermal processing (RTP) system. The silicon layer and/or the Czochralski or magnetic Czochralski silicon substrate may be supported by a holding fixture in a thermal processing system, for example. According to an embodiment, the annealing is carried out for a duration between 30 minutes to four hours.

Proton irradiation and annealing lead to doping by hydrogen-supported thermal donor formation such as hydrogen-related shallow donor complexes, e.g. hydrogen-vacancy donor complexes.

In some embodiments, a control terminal contact is formed, for example a gate electrode or a gate electrode contact or a base contact.

In some embodiments, the semiconductor device is formed as one device of a power semiconductor diode, a power insulated gate bipolar transistor, a power bipolar junction transistor, a power thyristor, and a power insulated gate field effect transistor. The semiconductor device may be formed as a vertical power semiconductor device. The first load terminal contact may be formed at a first surface of a semiconductor body comprising the silicon layer. The second load terminal contact may be formed at a second surface of the semiconductor body opposite to the first surface. An edge termination structure may be formed at the first surface of the semiconductor body surrounding an active area of the semiconductor device in an edge termination area. The edge termination area aims at shifting electrical breakdown into the active area for avoiding degradation of blocking voltage due to undesirable electrical breakdown in the edge termination that may be caused by curvature of equipotential lines in this area. Typical structural elements of junction termination structures in the edge termination area include one or more of field plates, ring structures such as floating guard rings or ring segments, junction termination extension (JTE) structures and variation of lateral doping (VLD) structures, for example.

Provision of the oxygen diffusion barrier allows to reduce fluctuations of a doping concentration in the silicon layer or in further semiconductor regions in the silicon layer, for example field stop zones by avoiding or counteracting diffusion of oxygen into the silicon layer from a substrate such as a Czochralski or magnetic Czochralski silicon substrate including oxygen incorporated therein.

Figure 2C:
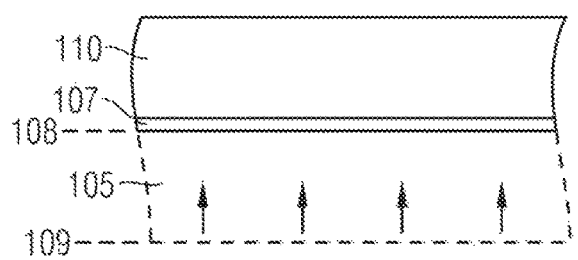

FIGS. 2A to 2C are schematic cross-sectional views of a Czochralski or magnetic Czochralski silicon substrate 105 for illustrating processes of a method of manufacturing a semiconductor device.

In the schematic cross-sectional view of FIG. 2A, an oxygen diffusion barrier 107 is formed on a first surface 108 the Czochralski or magnetic Czochralski silicon substrate 105. The first surface 108 is opposite to a second surface 109. The oxygen diffusion barrier may continuously cover the first surface 108 of the Czochralski or magnetic Czochralski silicon substrate 105.

Embodiments of the oxygen diffusion barrier 107 are illustrated next to the cross-sectional view.

The oxygen diffusion barrier 107 is exemplified by a SiGe diffusion barrier 1070. A maximum Ge content in the SiGe diffusion barrier 1070 may be set to a value between 1% and 40%, or to a value between 2% and 20%. In some embodiments, a thickness of the SiGe diffusion barrier 1070 is set to a value between 0.2 µm and 2 µm, or to a value between 0.5 µm and 1.5 µm. The feasible Ge concentration within the layers and their thickness depend also on the following thermal budget of device manufacturing to assure defect free semiconductor layers. The thickness of the SiGe diffusion barrier 1070 may be set smaller than a so-called critical thickness being a maximum thickness of the SiGe diffusion barrier that allows for defect-free epitaxial growth. The critical thickness may depend from the Ge content in the SiGe diffusion barrier 1070 and from a temperature during growth of the SiGe diffusion barrier 1070, for example.

Curve c1 illustrates one embodiment of the Ge content in the SiGe diffusion barrier 1070 along a vertical direction through the SiGe diffusion barrier 1070 that is constant or almost constant. A SiGe diffusion barrier having a Ge content profile similar to curve c1 may be manufactured by maintaining a constant or almost constant flow of CVD Si and Ge precursor gases into the CVD chamber, for example.

Curves c2, c3, c4 illustrate different embodiments of the Ge content in the SiGe diffusion barrier 1070 that increase continuously from the first surface 108 of the Czochralski or magnetic Czochralski silicon substrate 105 and along a direction perpendicular to the first surface 108. A SiGe diffusion barrier having a Ge content profile similar to curves c2, c3, c4 may be manufactured by a continuous increase of CVD Ge precursor gas flow relative to CVD Si precursor gas flow into a CVD chamber, for example. The increase of the Ge content in the SiGe diffusion barrier 1070 may be linear (curve c2), convex (curve c3), or concave (curve c4), for example.

Curve c5 illustrates one embodiment of the Ge content in the SiGe diffusion barrier 1070 along a vertical direction through the SiGe diffusion barrier 1070 that increases stepwise from the first surface 108 of the Czochralski or magnetic Czochralski silicon substrate 105 and along a direction perpendicular to the first surface 108. A SiGe diffusion barrier having a Ge content profile similar to curve c5 may be manufactured by stepwise increasing a flow of a CVD Ge precursor gas relative to a CVD Si precursor gas into a CVD chamber, for example.

The oxygen diffusion barrier 107 is also exemplified by a superlattice 1071 comprising Si and SiGe layers 1072, 1073. The thickness of each layer of the supperlattice 1071 may be chosen below a critical value from which crystal defect generation starts. A Ge content in each of the SiGe layers 1073 may be kept constant or almost constant (see curve c6) or may be increased from the first surface 108 of the Czochralski or magnetic Czochralski silicon substrate 105 and along a direction perpendicular to the first surface 108 (see curve c7). A maximum Ge content in the SiGe layers 1073 may also be increased in each SiGe layer 1073 with increasing distance to the first surface 108, for example. The superlattice may be grown from the first surface 108 in the sequence Si layer 1072/SiGe layer 1073 or in the sequence SiGe layer 1073/SiGe layer 1072. A number of SiGe/Si units in the superlattice 1071 may vary, for example be one, two, three, four, five, or even more.

Curves c8, c9, c10 illustrate different embodiments of the Ge content in the SiGe diffusion barrier 1070 that decrease continuously from the first surface 108 of the Czochralski or magnetic Czochralski silicon substrate 105 and along a direction x perpendicular to the first surface 108. A SiGe diffusion barrier having a Ge content profile similar to curves c8, c9, c10 may be manufactured by a continuous decrease of CVD Ge precursor gas flow relative to CVD Si precursor gas flow into a CVD chamber, for example. The decrease of the Ge content in the SiGe diffusion barrier 1070 may be linear (curve c8), convex (curve c9), or concave (curve c10), for example.

Curve c11 illustrates one embodiment of the Ge content in the SiGe diffusion barrier 1070 along a vertical direction through the SiGe diffusion barrier 1070 that decreases stepwise from the first surface 108 of the Czochralski or magnetic Czochralski silicon substrate 105 and along the direction x perpendicular to the first surface 108. A SiGe diffusion barrier having a Ge content profile similar to curve c11 may be manufactured by stepwise decreasing a flow of a CVD Ge precursor gas relative to a CVD Si precursor gas into a CVD chamber, for example.

Curves c12, c13, c14 illustrate embodiments of the Ge content in the SiGe diffusion barrier 1070 along a vertical direction through the SiGe diffusion barrier 1070 that increase continuously or stepwise in a first part, are constant in a second part, and decrease continuously or stepwise in a third part towards the first surface of the semiconductor body. The continuous increase and/or decrease may be linear (curve c12), convex (curve c13), concave (c14) or stepwise (curve c15).

A profile of the Ge content in the SiGe/Si units of the superlattice 1071 may also be adjusted to result in a convex, concave linear or stepwise increasing and/or decreasing Ge profile including an optional plateau.

In the schematic cross-sectional view of FIG. 2B, a silicon layer 110 is formed on the oxygen diffusion barrier 107. In some embodiments, the silicon layer 110 is formed by epitaxial growth or deposition, for example by chemical vapor deposition such as Atmospheric Pressure CVD (AP-CVD), Sub-Atmospheric Pressure CVD (SACVD), or Low-Pressure CVD (LPCVD).

A thickness of the silicon layer 110 may be set to a value between 40 µm and 200 µm. The value may depend from voltage blocking requirements of the semiconductor device, for example.

In some embodiments, material of the Czochralski or magnetic Czochralski silicon substrate 105 is removed from the second surface 109, see schematic cross-sectional view of FIG. 2C. The material may be removed by chemical and/or mechanical processes, for example by etching and/or grinding. In some embodiments, the Czochralski or magnetic Czochralski silicon substrate 105 is completely removed. The oxygen diffusion barrier may act as a etch stop or grinding stop layer. By way of example, a characteristic during etching and/or grinding may be altered when reaching the oxygen diffusion barrier. By detecting the change in the characteristic, etching and/or grinding may be stopped, for example.

Subsequent to FIG. 2B or FIG. 2C, optional proton irradiation and annealing may be carried out through one or both of opposite surfaces of a semiconductor body comprising the silicon layer 110 and a remaining part of the Czochralski or magnetic Czochralski silicon substrate 105. This results in doping by hydrogen-supported thermal donor formation such as hydrogen-related shallow donor complexes, e.g. hydrogen-vacancy donor complexes. Thereby, one or more field stop zone(s) may be formed, for example.

Then, doped semiconductor device regions are formed in the silicon layer 110. In some embodiments, source, body and drain regions of an IGFET are formed by ion implantation and/or diffusion of dopants into the silicon layer and/or Czochralski or magnetic Czochralski silicon substrate. In some other embodiments, source and body regions of an IGBT emitter and a bipolar injection region at an IGBT collector are formed by ion implantation and/or diffusion of dopants into the silicon layer and/or Czochralski or magnetic Czochralski silicon substrate. In some other embodiments, anode and cathode regions of a pn junction diode are formed by ion implantation and/or diffusion of dopants into the silicon layer and/or Czochralski or magnetic Czochralski silicon substrate. Additional functional semiconductor regions such as highly doped contact regions for providing ohmic contacts to load terminal contacts, highly doped carrier injection regions, buffer regions, or field stop zones may be formed. Also first and second load terminal contacts are formed. In some embodiments, the first and second load terminal contacts are source and drain contacts of an IGFET. In some other embodiments, the first and second load terminal contacts are anode and cathode contacts of a semiconductor power diode or a power diode. In some other embodiments, the first and second load terminal contacts are collector and emitter contacts of an IGBT or a BJT.

Figure 3:
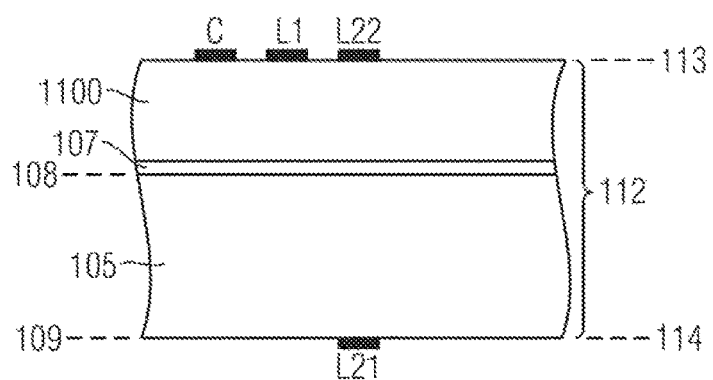
FIG. 3 is a schematic cross-sectional view of an embodiment of a semiconductor device comprising an oxygen diffusion barrier.

Processing of the silicon layer 110 and the Czochralski or magnetic Czochralski silicon substrate 105 results in a semiconductor device as illustrated in the schematic view of FIG. 3.

The semiconductor device comprises a semiconductor body 112 comprising opposite first and second surfaces 113, 114. A drift or base zone 1100, which is part of or corresponds to the silicon layer 110 of FIGS. 2A to 2C, is located between the first surface 113 and the oxygen diffusion barrier 107 and directly adjoins the oxygen diffusion barrier 107.

The semiconductor device further includes a first load terminal contact L1 at the first surface 113 of the semiconductor body 112 and a second load terminal contact L21 at the second surface 114 of the semiconductor body 112 for vertical power semiconductor devices. Alternatively, for lateral semiconductor devices, a second load terminal contact L22 is at the first surface 113 of the semiconductor body 112.

When the semiconductor device is formed as one device of a power insulated gate bipolar transistor, a power bipolar junction transistor, a power silicon controlled rectifier, and a power insulated gate field effect transistor, a control terminal contact C is at the first surface 113 of the semiconductor body 112. When the semiconductor device is formed as a power semiconductor diode semiconductor device, the load control terminal contact C is missing. In view of the vast variety of specific semiconductor devices that may be integrated in the semiconductor layer and/or Czochralski or magnetic Czochralski silicon substrate 105, illustration of functional semiconductor regions is missing in FIG. 3 for clarity reasons. Some embodiments of specific semiconductor devices having the basic design of FIG. 3 are illustrated and described with reference to FIGS. 4 to 6.

Figure 4:
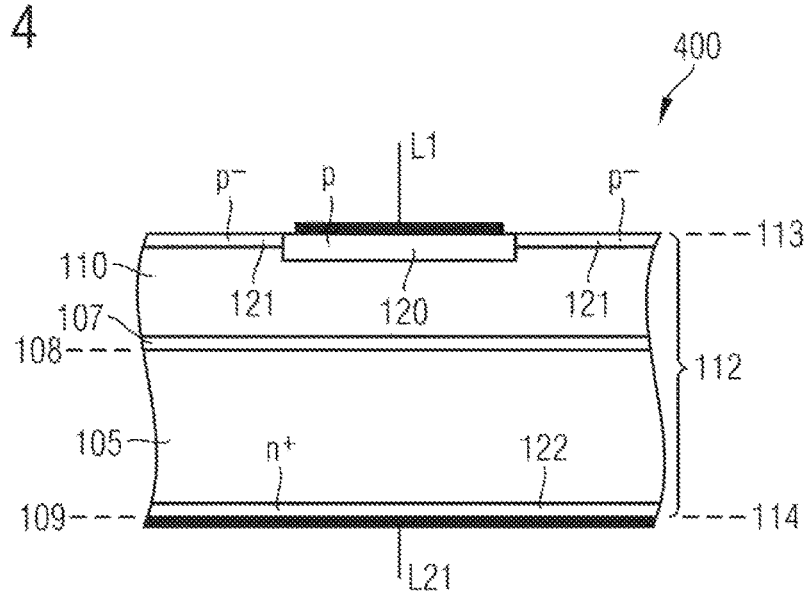
FIG. 4 is a schematic cross-sectional view of an embodiment of a power semiconductor diode comprising an oxygen diffusion barrier.

In the schematic cross-sectional view 400 of FIG. 4, the semiconductor device of FIG. 3 is illustrated as a power semiconductor diode comprising a p-doped anode region 120 and an optional $p^-$-doped junction termination extension (JTE) 121 surrounding the p-doped anode region 120 in an edge area of the power semiconductor diode. As an alternative or in addition to the JTE 121, other edge termination structures, for example field plates and/or ring structures may be formed. The p-doped anode region 120 is electrically connected to the first load terminal contact L1. The power semiconductor diode further includes an $n^+$-doped cathode contact region 122 at the second surface 114 that is electrically connected to the second load terminal contact L21 at the second surface 114.

Figure 5:
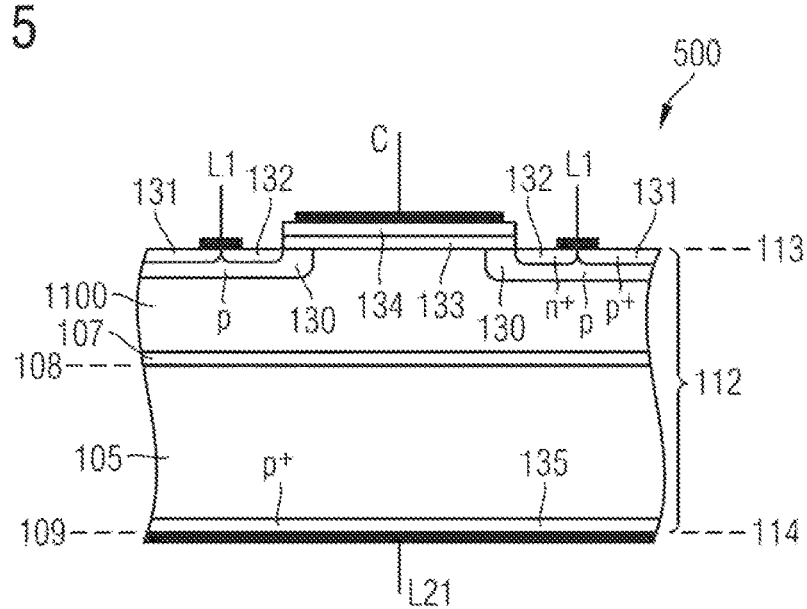
FIG. 5 is a schematic cross-sectional view of an embodiment of an IGBT comprising an oxygen diffusion barrier.

In the schematic cross-sectional view 500 of FIG. 5, the semiconductor device of FIG. 3 is illustrated as an IGBT comprising a p-doped body region 130, a $p^+$-doped body contact region 131 and an $n^+$-doped source region 132. A gate dielectric 133 electrically isolates a gate electrode 134 from the drift or base zone 1100. The gate electrode 134 is electrically connected to the control terminal contact C. In some embodiments, the gate electrode 134 corresponds to the control terminal contact C. The first load terminal contact L1, for example an emitter terminal contact is electrically connected to the p-doped body region 130 and to the $n^+$-doped source region 132. A $p^+$-doped bipolar injection region 135 at the second surface 114 is electrically connected to the second load terminal contact L21, for example a collector terminal contact.

In the embodiments of semiconductor devices described above, the Czochralski or magnetic Czochralski silicon substrate 105 may be partly or completely removed (see, for example FIG. 2C).

The planar gate structure illustrated in FIG. 5 may also be replaced by a trench gate structure in other embodiments.

Figure 6:
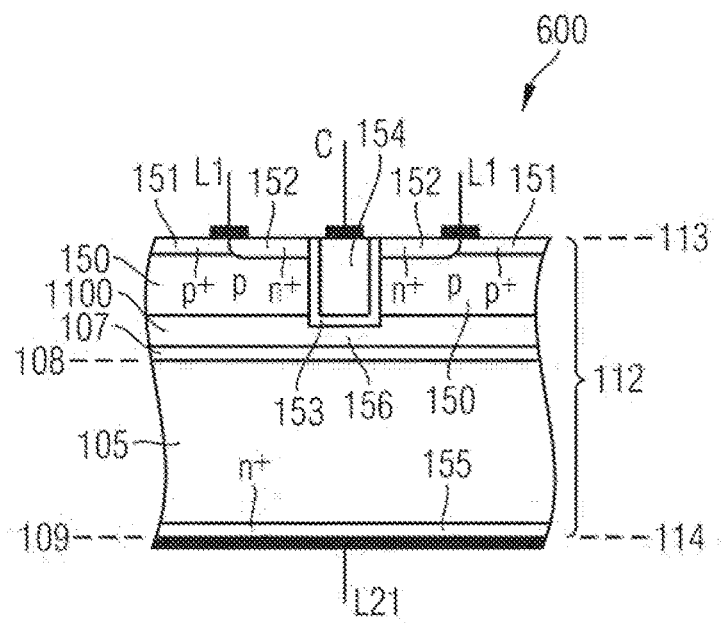
FIG. 6 is a schematic cross-sectional view of an embodiment of a trench gate IGFET comprising an oxygen diffusion barrier.

In the schematic cross-sectional view 600 of FIG. 6, the semiconductor device of FIG. 3 is illustrated as a trench gate IGFET comprising a p-doped body region 150, a $p^+$-doped body contact region 151 and an $n^+$-doped source region 152. A gate dielectric 153 in a trench 156 electrically isolates a gate electrode 154 from the drift or base zone 1100. The gate electrode 154 is electrically connected to the control terminal contact C. In some embodiments, the gate electrode 154 corresponds to the control terminal contact C. The first load terminal contact L1, for example a source terminal contact is electrically connected to the p-doped body region 150 and to the $n^+$-doped source region 152. An $n^+$-doped drain contact region 155 at the second surface 114 is electrically connected to the second load terminal contact L21, for example a drain terminal contact.

The Czochralski or magnetic Czochralski silicon substrate 105 may be partly or completely removed (see, for example FIG. 2C).

Figure 7:
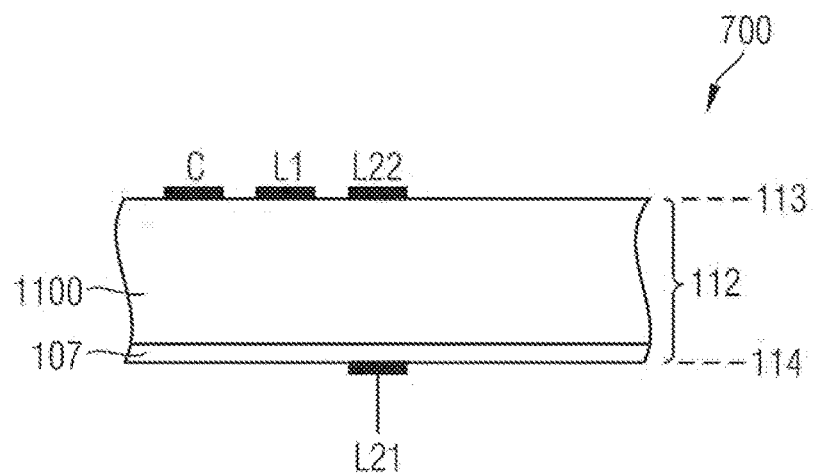
FIG. 7 is a schematic cross-sectional view of another embodiment of a semiconductor device comprising an oxygen diffusion barrier.

An embodiment of the semiconductor device illustrated in the schematic view of FIG. 3 and further comprising a completely removed silicon substrate 105 is illustrated in the schematic cross-sectional view 700 of FIG. 7. The second load terminal contact L21 is at the second surface 114 of the semiconductor body 112 for vertical power semiconductor devices directly adjoining the oxygen diffusion barrier 107.

Figure 8:
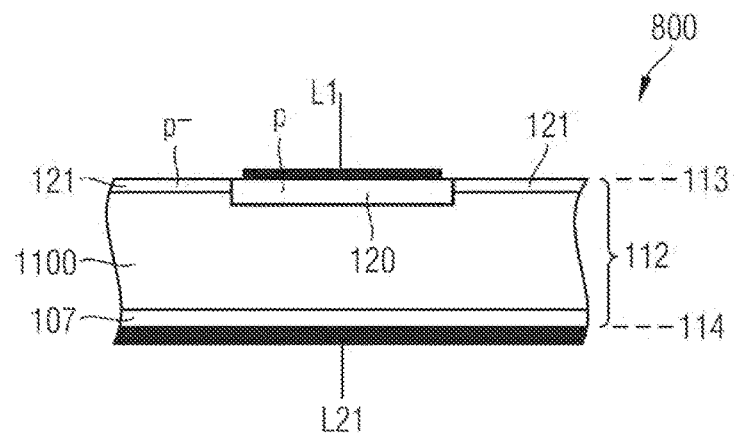
FIG. 8 is a schematic cross-sectional view of another embodiment of a power semiconductor diode comprising an oxygen diffusion barrier.

An embodiment of the power semiconductor diode illustrated in the schematic cross-sectional view 400 of FIG. 4 and further comprising a completely removed silicon substrate 105 is illustrated in the schematic cross-sectional view 800 of FIG. 8. The second load terminal contact L21 is at the second surface 114 of the semiconductor body 112 directly adjoining the oxygen diffusion barrier 107. The oxygen diffusion barrier 107 functions as the n⁺-doped cathode contact region 122 of the power semiconductor diode and may also be highly n-doped.

Figure 9:
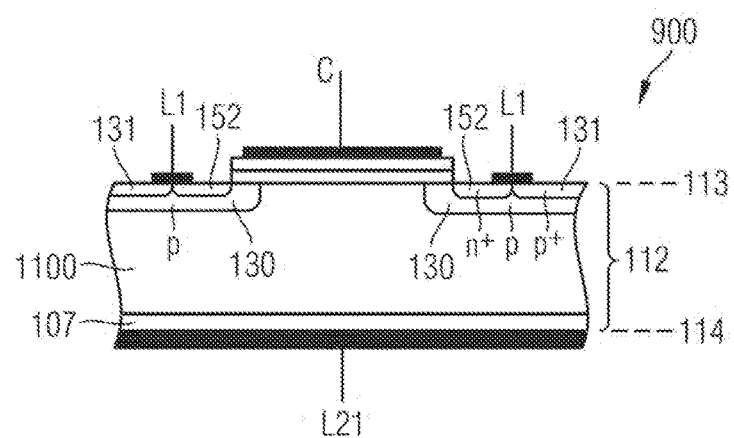
FIG. 9 is a schematic cross-sectional view of another embodiment of an IGBT comprising an oxygen diffusion barrier.

An embodiment of the IGBT illustrated in the schematic cross-sectional view 500 of FIG. 5 and further comprising a completely removed silicon substrate 105 is illustrated in the schematic cross-sectional view 900 of FIG. 9. The second load terminal contact L21 is at the second surface 114 of the semiconductor body 112 directly adjoining the oxygen diffusion barrier 107. The oxygen diffusion barrier 107 functions as the p⁺-doped bipolar injection region 135 of the IGBT and may also be highly p-doped.

Figure 10:
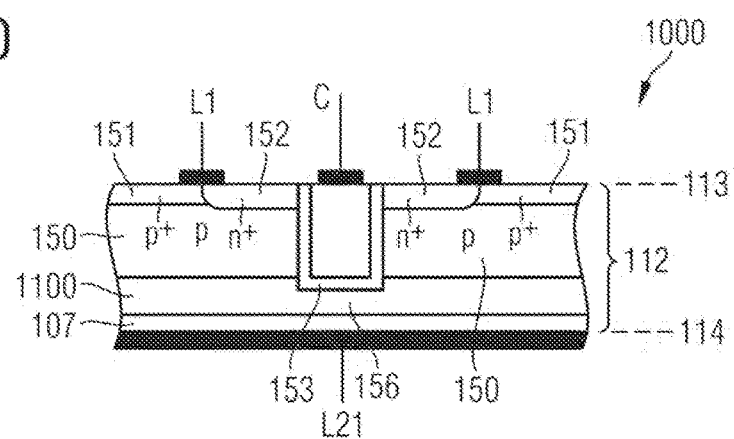
FIG. 10 is a schematic cross-sectional view of an another embodiment of a trench gate IGFET comprising an oxygen diffusion barrier.

An embodiment of the trench gate IGFET illustrated in the schematic cross-sectional view 600 of FIG. 6 and further comprising a completely removed silicon substrate 105 is illustrated in the schematic cross-sectional view 1000 of FIG. 10. The second load terminal contact L21 is at the second surface 114 of the semiconductor body 112 directly adjoining the oxygen diffusion barrier 107. The oxygen diffusion barrier 107 functions as the n⁺-doped drain contact region 155 of the trench gate IGFET and may also be highly n-doped.

The oxygen diffusion barrier 107 may include an oxygen concentration in a range of $5 \times 10^{16}$ cm$^{-3}$ and $1 \times 10^{18}$ cm$^{-3}$, or $8 \times 10^{16}$ cm$^{-3}$ and $8 \times 10^{17}$ cm$^{-3}$, or $1 \times 10^{17}$ cm$^{-3}$ and $5 \times 10^{17}$ cm$^{-3}$. The oxygen concentration may be based on oxygen based complexes, for example B—O complexes, P—O complexes or V—O complexes. The large oxygen concentration allows to reduce a carrier lifetime and, thus, an emitter injection efficiency while maintaining good contact properties due to a high doping. Thereby, contact properties may be improved by increasing doping without suffering from excessive carrier injection efficiency.

The oxygen diffusion barrier 107 may be one of an n-doped diode emitter region, an n-doped drain region, and a p-doped emitter region.

The IGFET may also be formed as a super junction IGFET for achieving a best trade-off between the specific on-resistance and the breakdown voltage. Charge compensation of an n-doped drift zone may be achieved by p-doped charge compensation regions arranged between n-doped drift zone parts or by field electrodes arranged between n-doped drift zone parts and field electrodes electrically isolated from the n-doped drift zone parts by a field dielectric, for example. The one or more field electrodes may be arranged in the trench 156 below the gate electrode 154, for example by extending the trench further into the drift or base zone 1100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:

forming an oxygen diffusion barrier on a first surface of a Czochralski or magnetic Czochralski silicon substrate;
forming a silicon layer on the oxygen diffusion barrier;
forming p-doped and n-doped semiconductor device regions in the silicon layer; and
forming first and second load terminal contacts.

2. The method of claim 1, wherein forming the oxygen diffusion barrier comprises forming a SiGe diffusion barrier.

3. The method of claim 2, wherein a maximum Ge content in the SiGe diffusion barrier is set to a value between 1% and 40%.

4. The method of claim 2, wherein a thickness of the SiGe diffusion barrier is set to a value between 0.2 µm to 2 µm.

5. The method of claim 2, wherein a Ge content in the SiGe diffusion barrier is set to increase continuously or stepwise from a surface of the Czochralski or magnetic Czochralski silicon substrate along a direction perpendicular to the surface.

6. The method of claim 2, wherein a Ge content in the SiGe diffusion barrier is set to decrease continuously or stepwise from a surface of the Czochralski or magnetic Czochralski silicon substrate along a direction perpendicular to the surface.

7. The method of claim 2, wherein a Ge content in the SiGe diffusion barrier is set, from a surface of the Czochralski or magnetic Czochralski silicon substrate along a direction perpendicular to the surface, to increase continuously or stepwise in a first part, to be constant value in a second part, and to decrease continuously or stepwise in a third part.

8. The method of claim 2, wherein the SiGe diffusion barrier is formed as a superlattice comprising SiGe and Si layers.

9. The method of claim 2, further comprising adding carbon to the SiGe diffusion barrier.

10. The method of claim 2, wherein a thickness of the silicon layer is set to a value between 40 µm and 200 µm.

11. The method of claim 1, further comprising removing material of the Czochralski or magnetic Czochralski silicon substrate from a second surface of the Czochralski or magnetic Czochralski silicon substrate opposite to the first surface.

12. The method of claim 11, wherein the Czochralski or magnetic Czochralski silicon substrate is completely removed.

13. The method of claim 1, further comprising forming hydrogen related donors in at least one of the silicon layer and the Czochralski or magnetic Czochralski silicon substrate.

14. The method of claim 1, further comprising forming a control terminal contact.

15. The method of claim 1, further comprising forming the semiconductor device as one device of a power semiconductor diode, a power insulated gate bipolar transistor, a power bipolar junction transistor, a power silicon controlled rectifier, and a power insulated gate field effect transistor.

16. The method of claim 1, further comprising forming the semiconductor device as a vertical power semiconductor device, forming the first load terminal contact at a first surface of a semiconductor body comprising the silicon layer and forming the second load terminal contact at a second surface of the semiconductor body opposite to the first surface, and further comprising forming an edge termination structure at the first surface of the semiconductor body surrounding an active area of the semiconductor device.

* * * * *